United States Patent
Nguyen et al.

(10) Patent No.: US 11,663,079 B2
(45) Date of Patent: May 30, 2023

(54) DATA RECOVERY USING A COMBINATION OF ERROR CORRECTION SCHEMES

(71) Applicant: Micron Technology, Inc., Boise, ID (US)

(72) Inventors: Dung V. Nguyen, San Jose, CA (US); Phong Sy Nguyen, Livermore, CA (US); Sivagnanam Parthasarathy, Carlsbad, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/540,059

(22) Filed: Dec. 1, 2021

(65) Prior Publication Data

US 2022/0253354 A1    Aug. 11, 2022

Related U.S. Application Data

(60) Provisional application No. 63/146,676, filed on Feb. 7, 2021.

(51) Int. Cl.
*G06F 11/10* (2006.01)
*H03M 13/15* (2006.01)
*G06F 11/07* (2006.01)

(52) U.S. Cl.
CPC ........ *G06F 11/1076* (2013.01); *G06F 11/076* (2013.01); *G06F 11/0772* (2013.01); *H03M 13/1575* (2013.01)

(58) Field of Classification Search
CPC ............... G06F 11/076; G06F 11/0772; G06F 11/1076; H03M 13/1575
USPC ........................................................ 714/6.24
See application file for complete search history.

(56) References Cited

U.S. PATENT DOCUMENTS

| | | | |
|---|---|---|---|
| 9,170,876 B1* | 10/2015 | Bates | G06F 11/1048 |
| 2015/0193299 A1* | 7/2015 | Hyun | G11C 29/028 |
| | | | 714/6.24 |
| 2018/0159560 A1* | 6/2018 | Sharon | H03M 13/1111 |
| 2019/0303236 A1* | 10/2019 | Ellis | G06F 3/065 |
| 2019/0340062 A1* | 11/2019 | Cai | G06F 11/1004 |
| 2020/0042384 A1* | 2/2020 | Kumar | H03M 13/2963 |
| 2021/0211142 A1* | 7/2021 | Hyodo | H03M 13/6337 |
| 2021/0224151 A1* | 7/2021 | Lee | H03M 13/1111 |
| 2022/0365706 A1* | 11/2022 | Yang | G06F 3/0655 |

* cited by examiner

*Primary Examiner* — Chae M Ko
(74) *Attorney, Agent, or Firm* — Nicholson De Vos Webster & Elliott LLP

(57) ABSTRACT

Exemplary methods, apparatuses, and systems include receiving a request for a segment of data. The requested segment data is one of a plurality of segments of data in a stripe of data. A failure to decode the requested segment is detected. Each of the plurality of segments in the stripe other than the requested segment are read. Reading each segment includes reading raw encoded data and attempting to decode the raw encoded data, the result of reading each segment including decoded data when decoding is successful and the raw encoded data when decoding fails. A combined result of each read is generated. The combining includes combining decoded data for segments that were successfully decoded and the raw encoded data for segments for which decoding failed. A statistical model for the requested segment is updated using the combined result. The requested segment is decoded using the updated statistical model.

20 Claims, 13 Drawing Sheets

DATA RECOVERY USING A COMBINATION OF ERROR CORRECTION SCHEMES

CROSS-REFERENCE TO RELATED APPLICATION

The present application claims the benefit of U.S. Provisional Patent Application No. 63/146,676 filed on Feb. 7, 2021, which is hereby incorporated by reference.

TECHNICAL FIELD

The present disclosure generally relates to data recovery, and more specifically, relates to probabilistic data recovery using a combination of error correction schemes.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
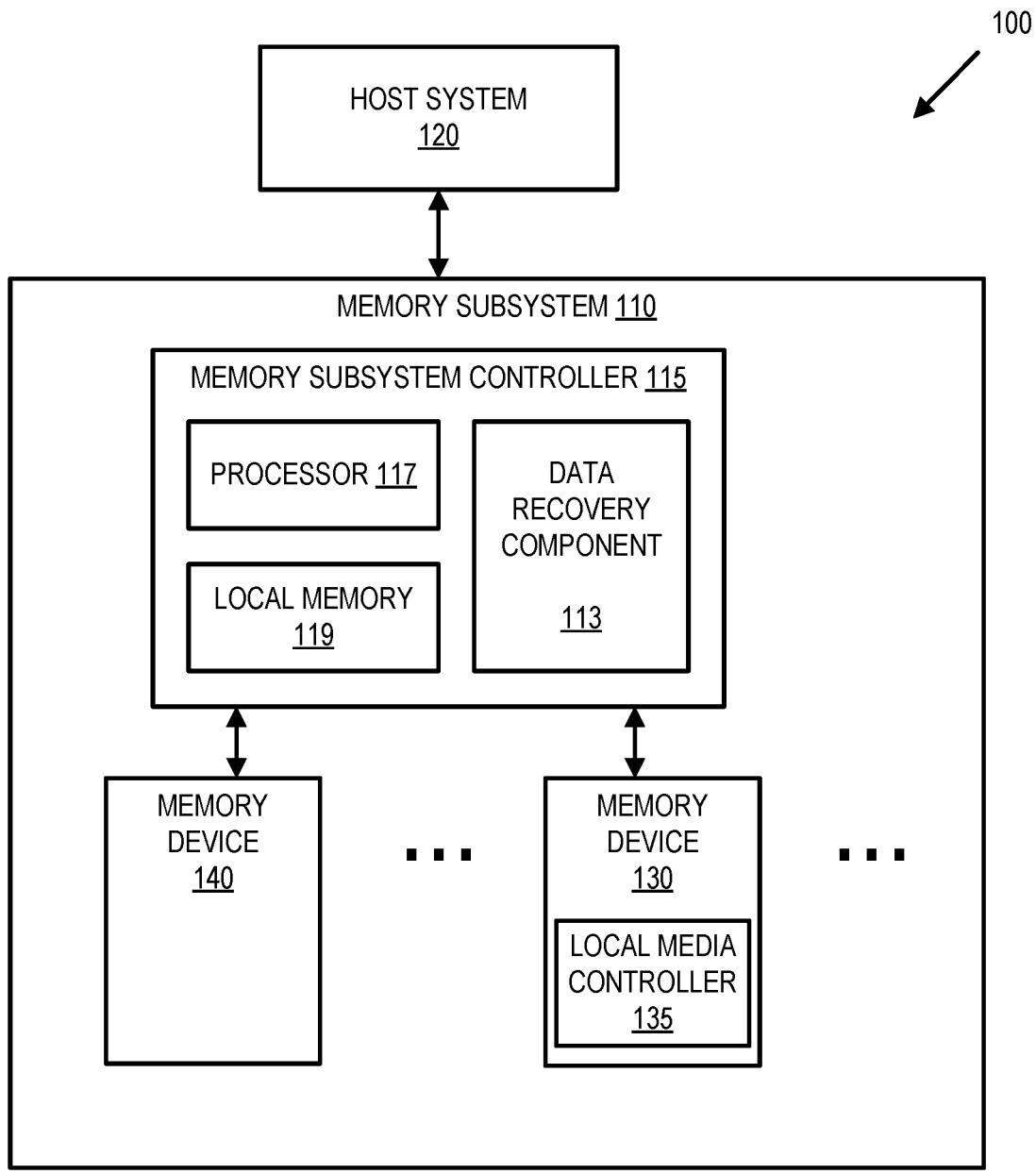
FIG. 1 illustrates an example computing system that includes a memory subsystem in accordance with some embodiments of the present disclosure.

Aspects of the present disclosure are directed to probabilistic data recovery in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Memory devices (e.g., non-volatile memory) can suffer from errors in the writing or retention of bits that are stored within the memory devices. An error correcting code (ECC) is a mechanism to correct these errors in the memory. ECC uses redundant data, referred to as parity data, to enable the ECC process to recover and correct errors in the normal data. Parity bits are utilized in conjunction with normal data bits, which are both stored in the memory device, and are utilized by the ECC process to detect and correct any bit errors in the stored data when the parity bits are not consistent with their associated data. Highly effective ECC processes can utilize low-density parity codes (LDPC), Bose, Chaudhri, and Hocquenghem (BCH) codes, Reed-Solomon codes, and similar code systems as part of the ECC process. These codes are derived from the data stored data in the memory devices and can be used to correct the memory data where errors occur. Such processes can use statistical models, such as log likelihood ratio (LLR), to represent the data to correct errors.

Memory subsystem can utilize multiple ECC processes to correct errors. For example, if an LDPC decoder fails to recover a translation unit (TU) or other segment of data, a memory device can attempt recovery using parity data derived from that segment of data and other segments of data that, together, make up a stripe in a redundant array of independent nodes (RAIN). As used herein, nodes refer to storage devices (i.e., storage nodes), storage servers, etc. In one embodiment, RAIN refers to a redundant array of independent NAND. A parity TU can be formed by generating the result of applying an exclusive-or (XOR) to all of the user data TU's in the stripe. Traditional data recovery using RAIN parity data (in which there is only one RAIN parity segment), however, is limited to a single failed TU. Including additional segments of parity data can increase data recovery capabilities but results in an undesirable increase in storage overhead.

Aspects of the present disclosure address the above and other deficiencies by using a combination of error correction schemes such that RAIN parity data can be used to recover data when multiple TU's in a stripe have suffered decoding failures without the increase in storage overhead resulting from additional stripe parity data. In particular, RAIN parity data can be used to modify the statistical modeling of an ECC process, such as LDPC. As a result, a data recovery component of a memory subsystem can recover more than one failed TU in a RAIN stripe, enabling greater data reliability and/or greater tolerance of manufacturing variations in memory devices.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM)

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a data recovery component 113 that can implement probabilistic data recovery using a combination of error correction schemes. In some embodiments, the controller 115 includes at least a portion of the data recovery component 113. For example, the controller 115 can include a processor 117 (processing device) configured to execute instructions stored in local memory 119 for performing the operations described herein. In some embodiments, a data recovery component 113 is part of the host system 120, an application, or an operating system.

The data recovery component 113 can detect a failure to decode a requested segment of data and use other segments of the same stripe of data to update a statistical model for the requested segment. The data recovery component 113 decodes the requested segment using the updated statistical model. Further details with regards to the operations of the data recovery component 113 are described below.

Figure 2:
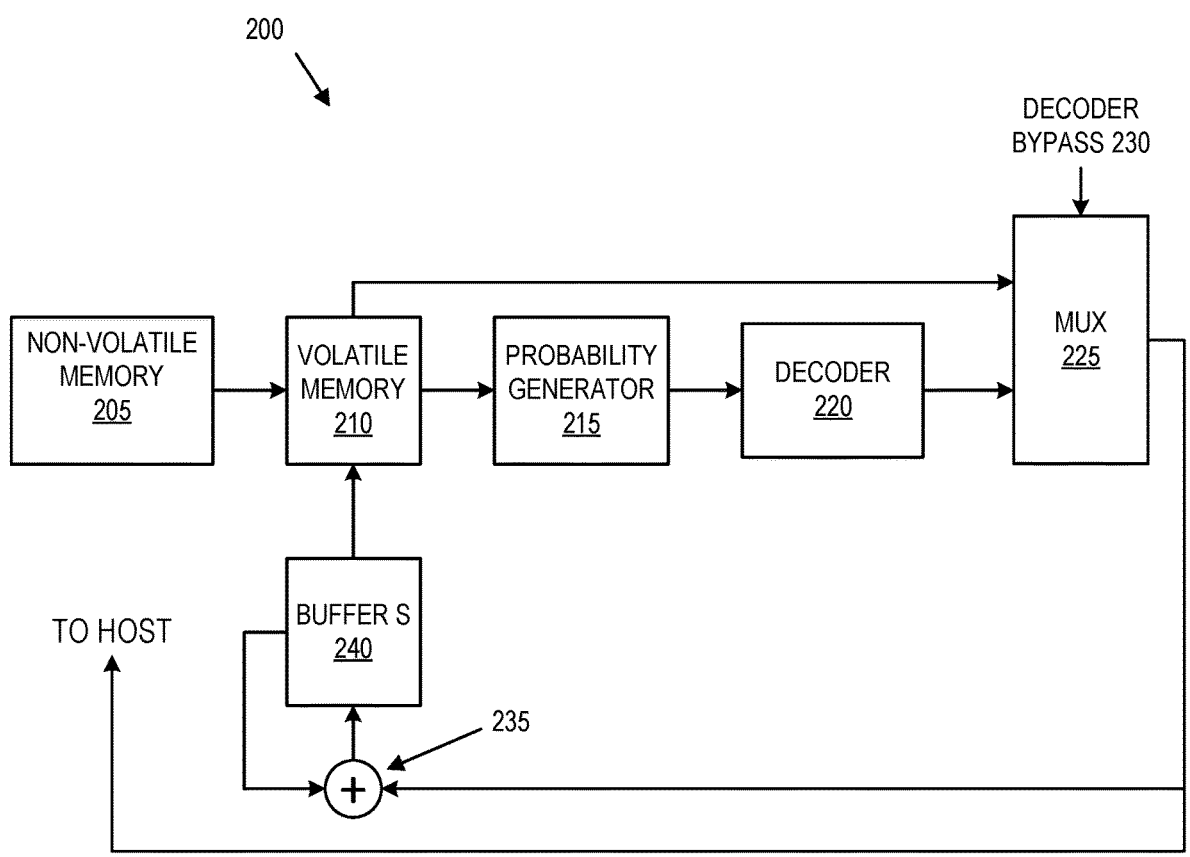
FIG. 2 is a block diagram of logic and memory subsystem components to implement data recovery in accordance with some embodiments of the present disclosure.

FIG. 2 is a block diagram of logic and memory subsystem components 200 to implement data recovery in accordance with some embodiments of the present disclosure. One or more of the logic and memory subsystem components 200 can be implemented as a part of data recovery component 113 and/or memory subsystem controller 115. The logic and memory subsystem components 200 include non-volatile memory 205 and volatile memory 210, which can be implemented by memory devices 130 and 140, respectively.

Non-volatile memory 205 stores user data and parity data. For example, non-volatile memory 205 can be configured to store encoded data in RAIN stripes. In another embodiment, non-volatile memory 205 stores encoded data in RAID (redundant array of independent disks) stripes.

Volatile memory 210 temporarily stores user data, parity data, statistical models and other data when raw encoded data is read from non-volatile memory, decoded, or otherwise used during data recovery according to embodiments of the present disclosure. In one embodiment, decoded data is provided to host system 120 by temporarily storing the decoded data in volatile memory 210 and responding to a read request form host system 120 with the location in volatile memory 210 storing the decoded data.

Probability generator 215 generates statistical models including values to indicate the likelihood that the data is correct. Memory devices can suffer from errors in the writing or retention of bits that are stored within the memory devices due to drift, read disturb, or other parasitic effects. In one embodiment, probability generator 215 generates likelihood values based on a comparison of a read voltage level and a threshold voltage level. For example, multiple sensing levels can be used to detect the binary values of bits within a segment. In one embodiment, reading a segment includes reading data at a "hard read" sensing level and one or more "soft read" sensing levels to generate the likelihood values. In one embodiment, the probability generator 215 generates an LLR value based upon these sensing levels.

Decoder 220 decodes the raw encoded data read from non-volatile memory 205. In one embodiment, decoder 220 uses an iterative process of adjusting the values of the raw encoded bits in order to satisfy one or more parity checks. For example, decoder 220 can use the LLR or other statistical model provided by probability generator 215 to iteratively adjust the values of the encoded bits in an attempt to satisfy the parity check(s). In one embodiment, decoder 220, when successful in decoding data, generates decoded data along with a statistical model for that data. The statistical model generated by 220 can be another LLR, syndrome weights, or another indication of the likelihood that the bit values are correct. In one embodiment, when decoder 220 fails to satisfy the parity check(s), decoder 220 generates an indication of decoding failure as well as an output vector, syndrome weights, or other data or metadata related to the attempt at decoding the segment. In one embodiment, decoder 220 is an LDPC decoder.

MUX 225 is a multiplexer or similar device that allows for the selection between different inputs for output. For example, an inactive value on decoder bypass 230 can select the output of decoder 220, i.e., the decoded segment of data, and an active value on decoder bypass 230 can select the raw encoded data (i.e., undecoded data/encoded data with the possibility of flipped or noisy bits). In one embodiment, the raw encoded data is provided as an input to MUX 225 by volatile memory 210. In another embodiment, the raw encoded data is provided along with a statistical model provided by probability generator 215 (while still bypassing decoder 220).

In one embodiment, decoder bypass 230 is set to an active state (selecting the raw encoded data as an output) in response to a decoding failure. In other words, decoder bypass 230 can be set to an active state or inactive state at various stages of the data recovery process. For example, data recovery component 113 can set decoder bypass 230 to an active state in response to comparing the initial syndrome weight of a segment and the syndrome weight of the segment at termination of decoding or otherwise when decoder 220 determines that decoding has failed. From the initial syndrome weight, data recovery component 113 estimates how many erroneous bits there are in the segment. Based on the final syndrome weight and the number of bits flipped by the decoder, data recovery component 113 can also estimate how many erroneous bits there are in the output vector from the decoder (even when decoder 220 fails to decode a segment, there is still an output vector). One or more of the syndrome weights or bits flipped can be used to trigger the setting of decoder bypass 230 to an active state. In one embodiment, data recovery component 113 sets decoder bypass 230 to an active state in response to the ratio of the initial syndrome weight and the number of bit flips satisfying a threshold value. For example, if the ratio is less than or equal to the threshold, data recovery component 113 sets decoder bypass 230 to an active state.

The output of MUX 225 is subjected to combination logic 235 and the result is stored in Buffer S 240. In one embodiment, the memory subsystem 110 compresses or removes statistical model data from a result of a segment read before passing the segment to combination logic 235 or as a part of combination logic 235. For example, compressing statistical data can include rounding a value to enable the use of fewer bits to represent that value. Combination logic 235 can be implemented in firmware, hardware, or a combination thereof.

In one embodiment, combination logic 235 provides a simple XOR operation between the current contents of Buffer S 240 and the output of MUX 225. For example, combination logic 235 can XOR hard read values of segments of data. In one embodiment, the combination is the min operation, i.e., selecting the smallest absolute value among the statistical model data. In another embodiment, the combination includes applying different scaling factors to the statistical model data of segments that failed the decoding process based on syndrome weights and selecting a combined value from a lookup table (LUT) based on the scaled statistical model data. In one embodiment, the entries/values of the lookup table are pre-determined by an optimization process using techniques, such as a hill climbing algorithm. In another embodiment, combination logic 235 uses a lookup table and/or a function to combine the output of MUX 225 with the contents of Buffer S 240. For example, combination logic 235 can use statistical model data, such as number of failed segments in the RAIN stripe, initial syndrome weight(s), syndrome weight(s) at termination of decoding, a number of bit-flips during decoding, or other decoding status data, and hard read data values to select a combined value or scaling factor from a lookup table. As another example, combination logic 235 can combine segments by generating a product of the lookup table output (LUT_output), such as a scaling factor, and statistical model data from each read:

$$LLR(c_1)=LUT\_output \times \Pi_{i=2,3,\ldots,n} \text{sign}(LLR(ci))$$

The result generated by combination logic 235, as applied in a successive manner to each segment, is stored in Buffer S 240. When all other segments of the stripe have been combined, the resulting combined value stored in Buffer S 240 is used to modify the statistical model of the segment that failed in decoding and is being recovered. For example, similar to the combination process described above, the result generated by combination logic 235 can be used to access a value in a lookup table to select a scaling factor to apply to the LLR or other statistical model for the segment that failed in decoding and is being recovered. The updated statistical model can then be used in the soft decoding process for the requested segment.

Data recovery using logic and memory subsystem components 200 is described further with reference to FIGS. 3-9.

Figure 3:
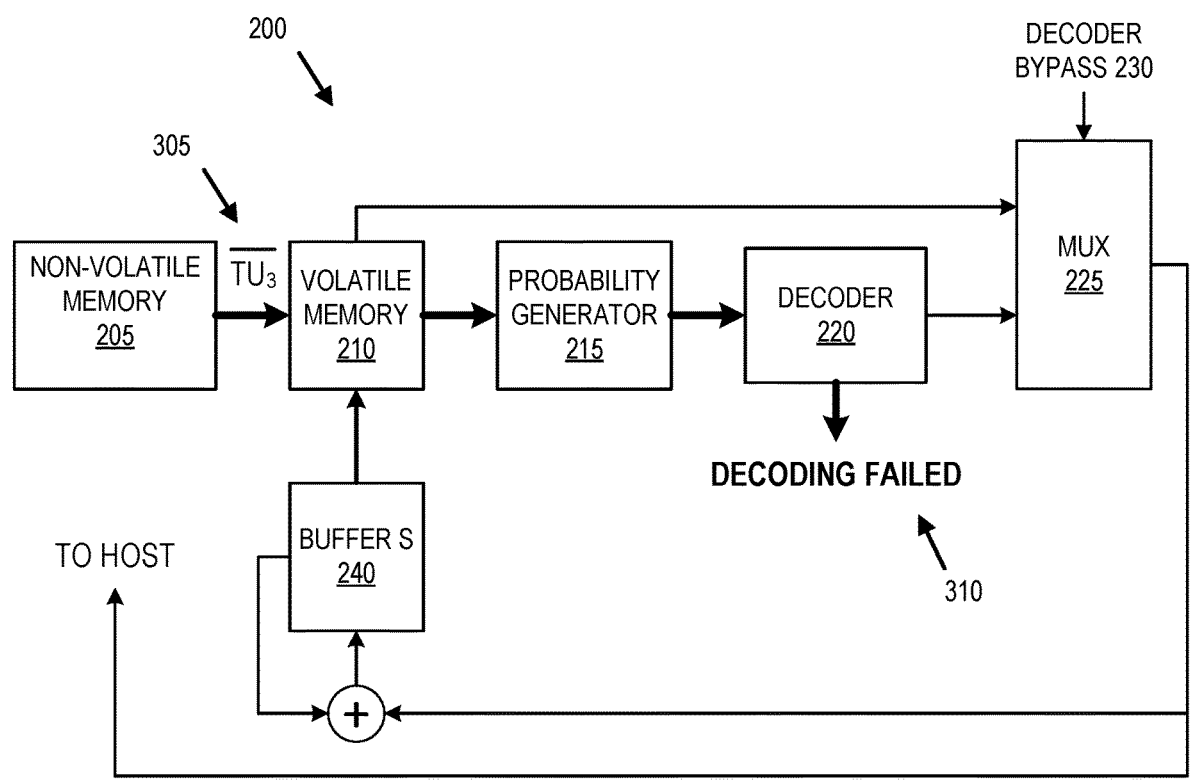
FIG. 3 is an example of the use of logic and memory subsystem components to implement data recovery in accordance with some embodiments of the present disclosure.

FIGS. 3-9 illustrate an example of the use of logic and memory subsystem components 200 to implement data recovery in accordance with some embodiments of the present disclosure. In FIG. 3, memory subsystem 110 reads an encoded segment $\overline{TU_3}$ 305 from non-volatile memory 205 into volatile memory 210. For example, memory subsystem 110 can execute a read in response to a request from host system 120 for segment $TU_3$. As used herein, the inclusion of a bar over a segment represents undecoded data and the lack of a bar over the segment represents decoded data.

Probability generator 215 generates a statistical model (e.g., LLR) based on the read and provides the encoded segment $\overline{TU_3}$ 305 and statistical model to decoder 220. Decoder 220 attempts to decode the segment $\overline{TU_3}$ 305 but fails 310. In response to the decoding failure, data recovery component 113 initiates probabilistic data recovery using a combination of error correction schemes.

Figure 4:
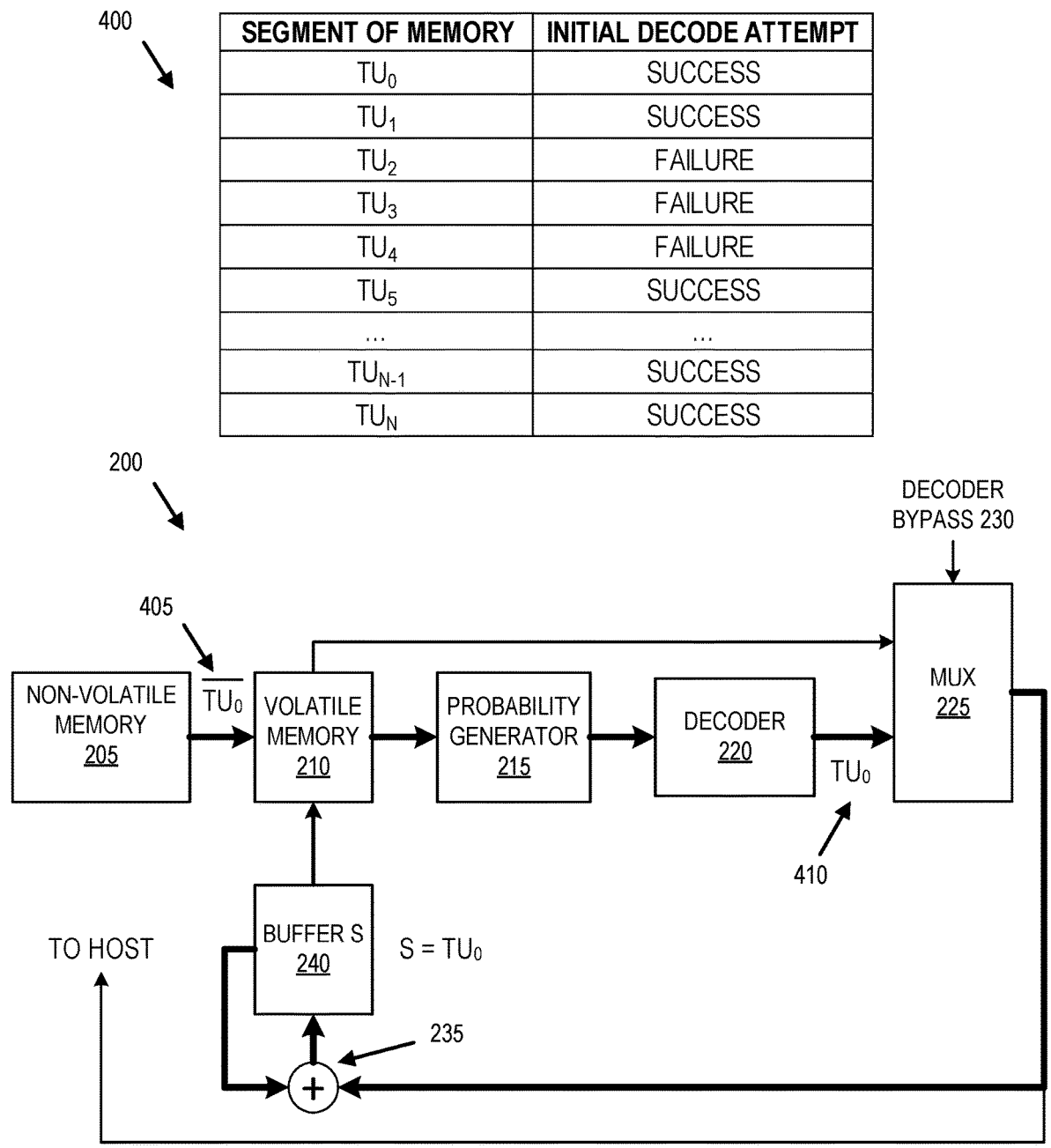
FIG. 4 is a continuation of the example of the use of logic and memory subsystem components to implement data recovery in accordance with some embodiments of the present disclosure.

In FIG. 4, in response to the decoding failure of encoded segment $\overline{TU_3}$ 305, data recovery component 113 initiates probabilistic data recovery using a combination of error correction schemes. Data recovery component 113 triggers a read of other segments of the same stripe as encoded segment $\overline{TU_3}$ 305. Table 400 illustrates that an initial decode attempt on each segment can either end in success or failure. The determined success or failure of the decoding of each segment will trigger how each segment is used to recover the requested data (as described further below). As illustrated, table 400 represents a stripe that contains multiple segments that failed the decoding process and, therefore, are not recoverable using, e.g., traditional RAIN stripe parity data alone.

Memory subsystem 110 reads an encoded segment $\overline{TU_0}$ 405 from non-volatile memory 205 into volatile memory 210. Probability generator 215 generates a statistical model (e.g., LLR) based on the read and provides the encoded segment $\overline{TU_0}$ 405 and statistical model to decoder 220. Decoder 220 successfully decodes the segment $\overline{TU_0}$ 405, resulting in decoded segment $TU_0$ 410. Given the success of decoder 220, decoder bypass 230 remains inactive and decoded segment $TU_0$ 410 (hard read data only or hard and soft read data combined) is passed by MUX 225 to combination logic 235. Buffer S 240 is currently empty, so the resulting combination results in Buffer S 240 storing decoded segment $TU_0$ 410 (or decoded segment $TU_0$ 410 combined with an initial/default value).

Figure 5:
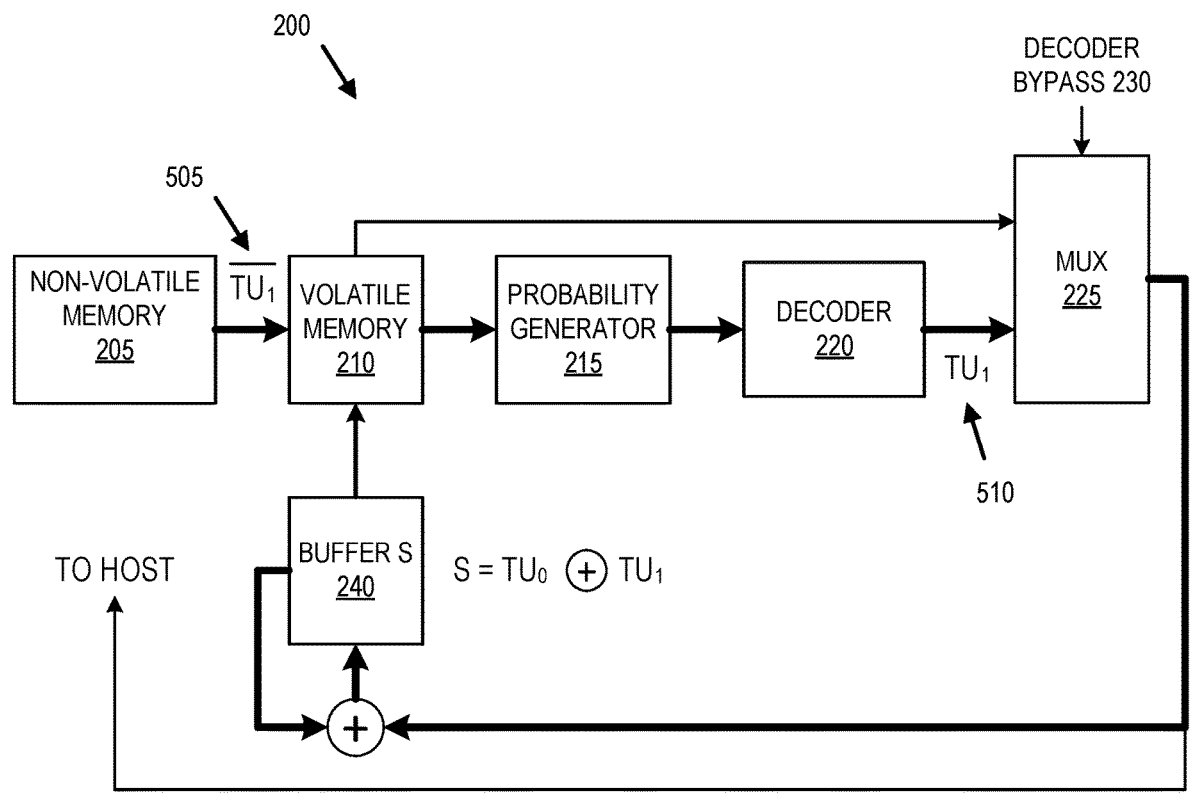
FIG. 5 is a continuation of the example of the use of logic and memory subsystem components to implement data recovery in accordance with some embodiments of the present disclosure.

In FIG. 5 memory subsystem 110 reads an encoded segment $\overline{TU_1}$ 505 from non-volatile memory 205 into volatile memory 210. Probability generator 215 generates a statistical model (e.g., LLR) based on the read and provides the encoded segment $\overline{TU_1}$ 505 and statistical model to decoder 220. Decoder 220 successfully decodes the segment $\overline{TU_1}$ 505, resulting in decoded segment $TU_1$ 510. Given the success of decoder 220, decoder bypass 230 remains inactive and decoded segment $TU_1$ 510 (hard read data only or hard and soft read data combined) is passed by MUX 225 to combination logic 235. Buffer S 240 is currently storing decoded segment $TU_0$ 410, so the resulting combination results in Buffer S 240 storing the combination of decoded segment $TU_0$ 410 and decoded segment $TU_1$ 510 (e.g., the result of an XOR of decoded segment $TU_0$ 410 and decoded segment $TU_1$ 510).

Figure 6:
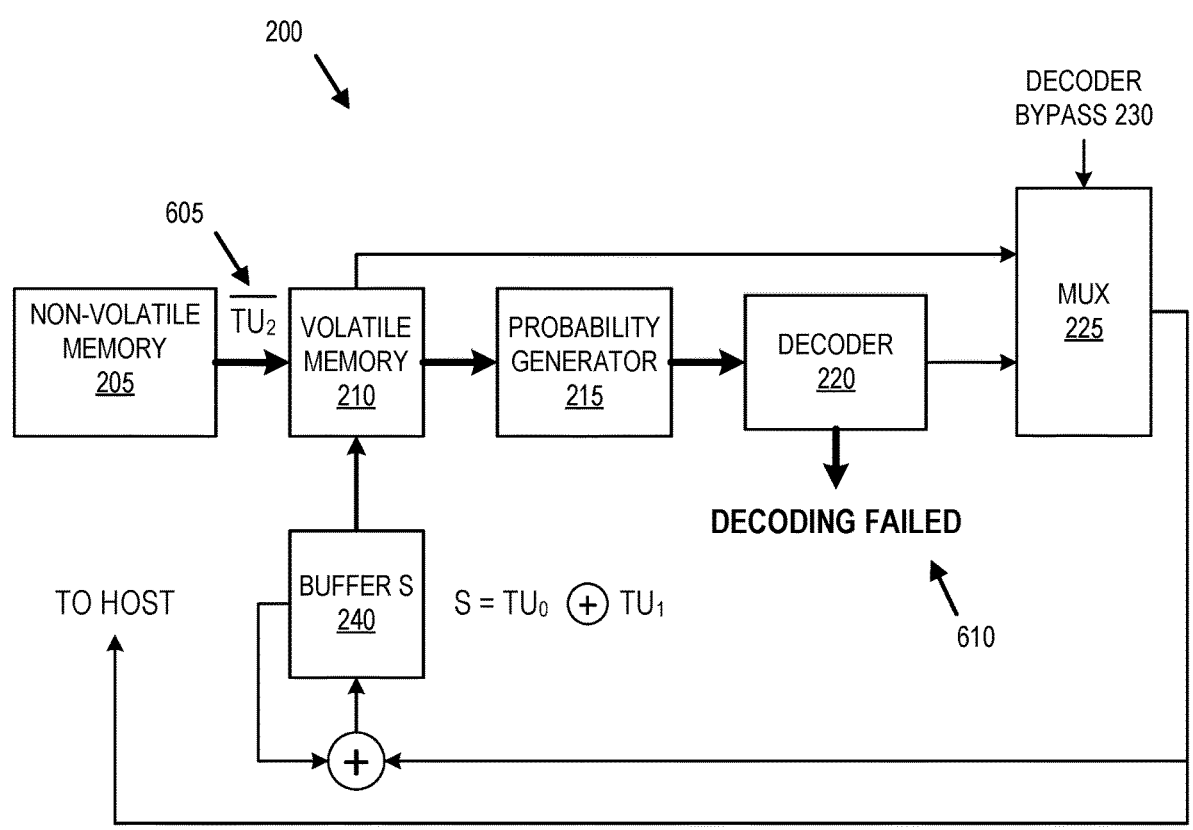
FIG. 6 is a continuation of the example of the use of logic and memory subsystem components to implement data recovery in accordance with some embodiments of the present disclosure.

In FIG. 6 memory subsystem 110 reads an encoded segment $\overline{TU_2}$ 605 from non-volatile memory 205 into volatile memory 210. Probability generator 215 generates a statistical model (e.g., LLR) based on the read and provides the encoded segment $\overline{TU_2}$ 605 and statistical model to decoder 220. Decoder 220 attempts to decode the segment $\overline{TU_2}$ 605 but indicates failure 610.

Figure 7:
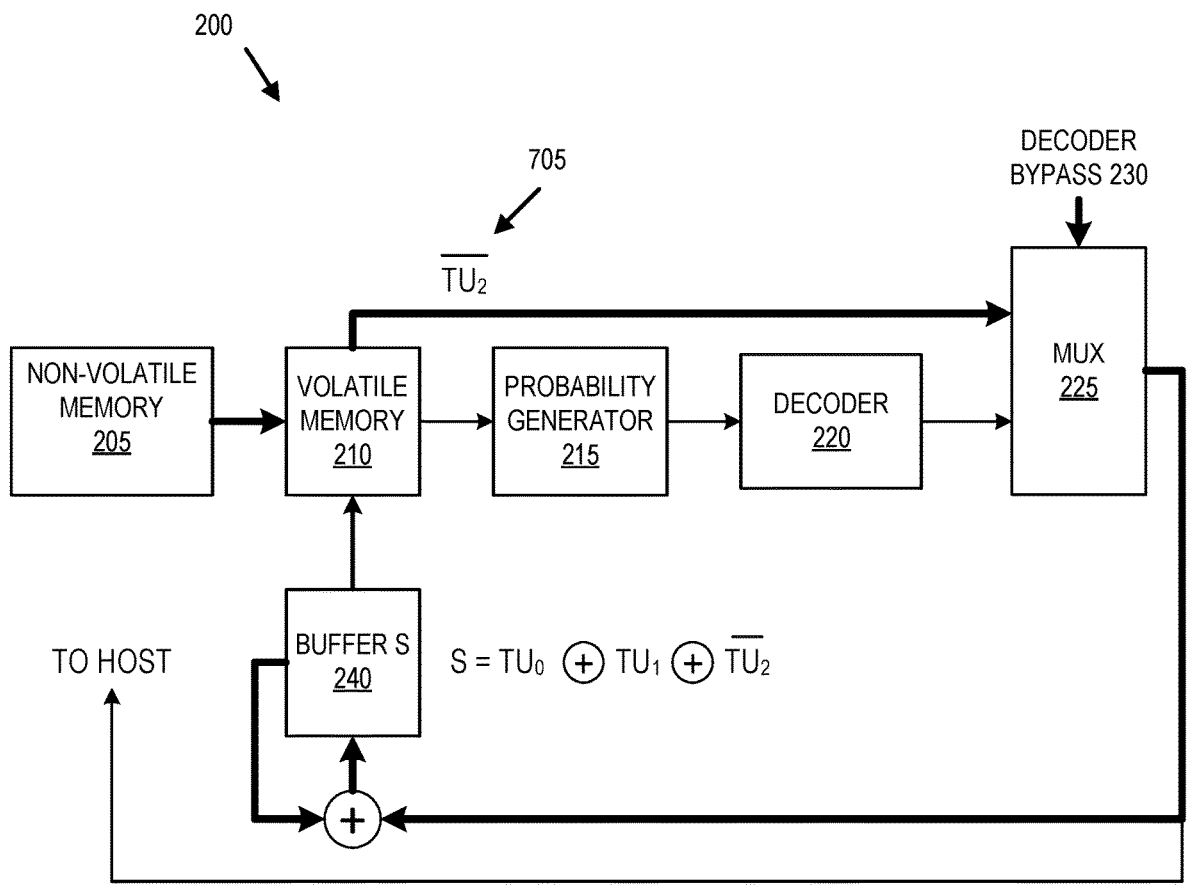
FIG. 7 is a continuation of the example of the use of logic and memory subsystem components to implement data recovery in accordance with some embodiments of the present disclosure.

In FIG. 7, in response to the failure to decode segment $\overline{TU_2}$ 605, data recovery component 113 activates decoder bypass 230 and passes encoded segment $\overline{TU_2}$ 605 to MUX 225 from volatile memory 210 (if no longer present, memory subsystem 110 can read segment $\overline{TU_2}$ 605 from non-volatile memory 205 again). MUX 225 passes encoded segment $\overline{TU_2}$ 605 to combination logic 235 and encoded segment $\overline{TU_2}$ 605 is combined with the current contents of Buffer S 240. For example, Buffer S 240 can now represent the result of decoded segment $TU_0$ 410 XOR decoded segment $TU_1$ 510 XOR encoded segment $\overline{TU_2}$ 605.

Figure 8:
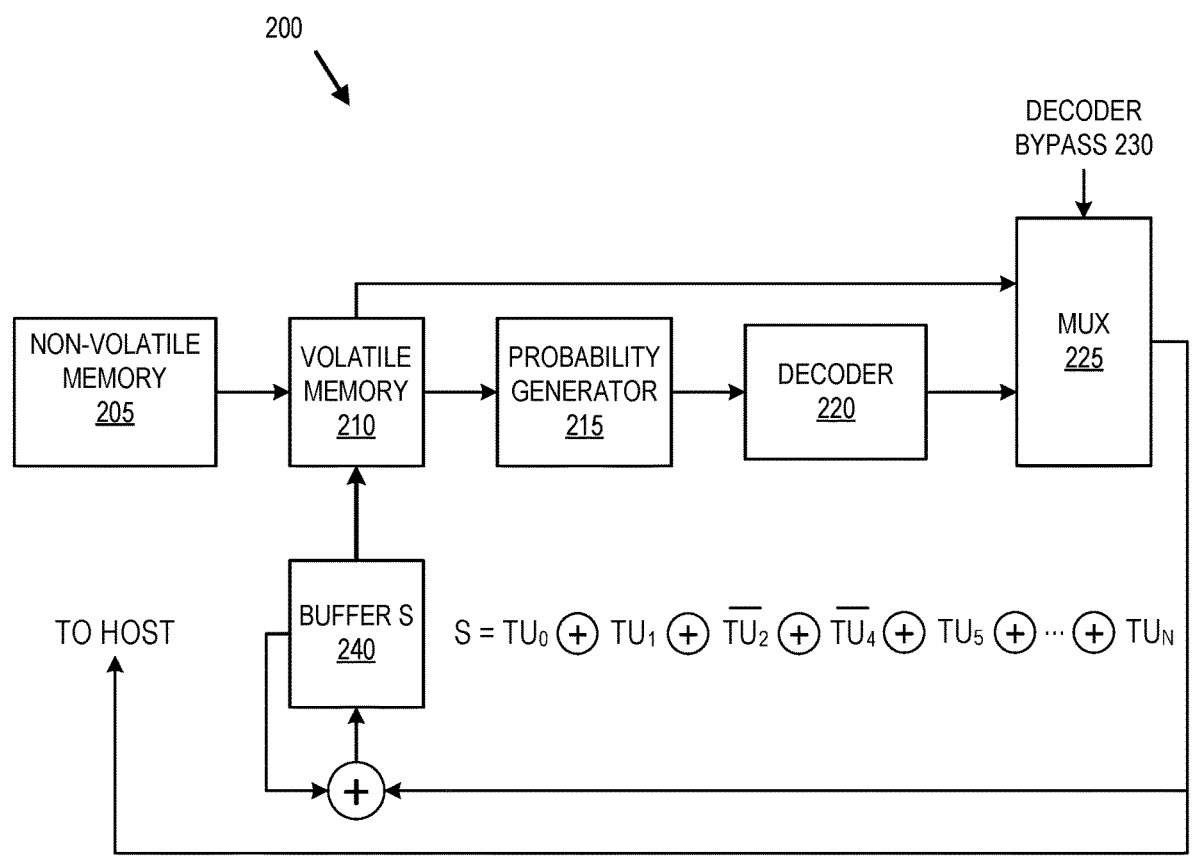
FIG. 8 is a continuation of the example of the use of logic and memory subsystem components to implement data recovery in accordance with some embodiments of the present disclosure.

FIG. 8 illustrates the result of continuing to read each of the other segments, $TU_4$ through $TU_N$. Each segment (encoded or decoded based upon decoder 220 failure or success) is combined with the contents of Buffer S 240. Given that this process is for the recovery of segment $TU_3$, segment $TU_3$ is omitted from the combination of read results in Buffer S 240. Encoded segment $\overline{TU_4}$ was combined due to a decoding failure, decoded segment $TU_5$ was combined due a decoding success, etc.

Figure 9:
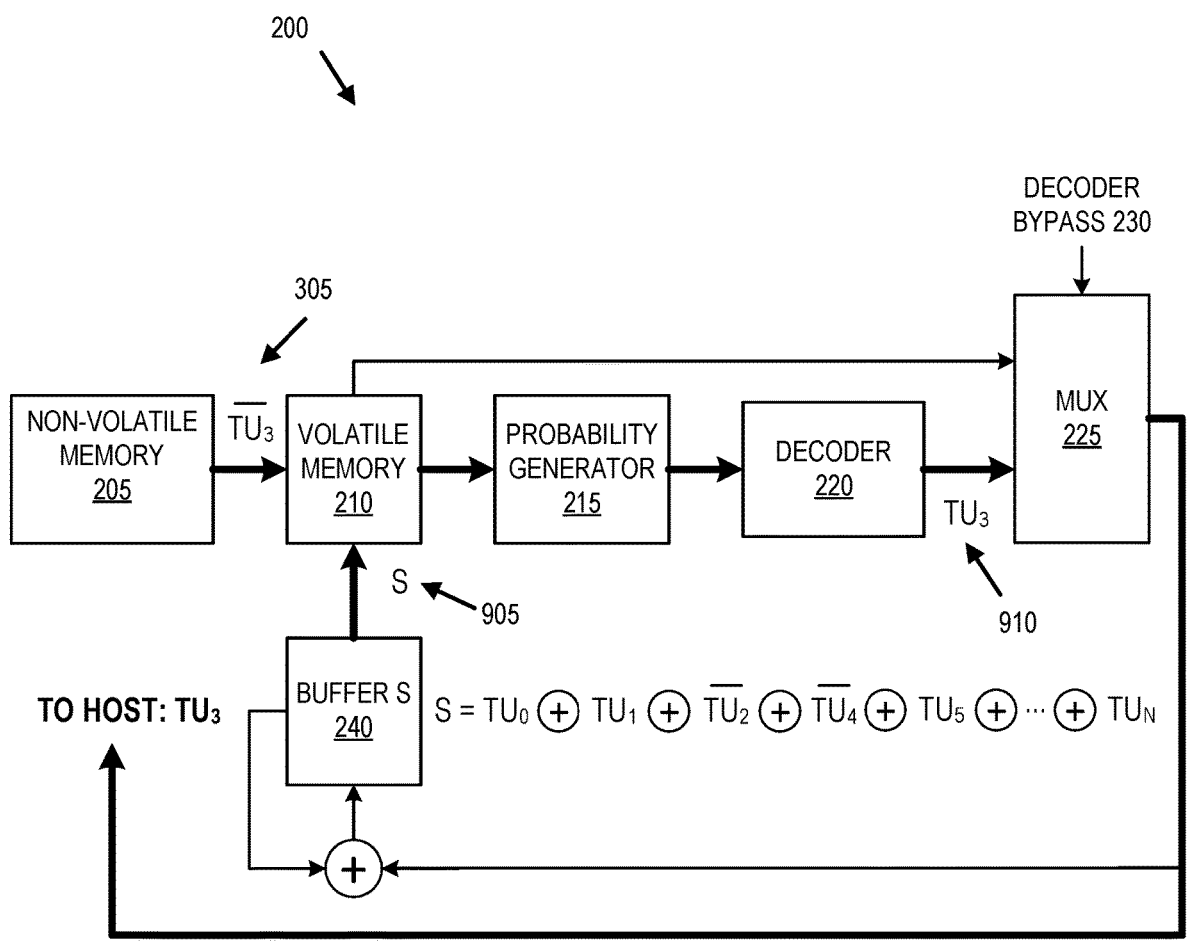
FIG. 9 is a continuation of the example of the use of logic and memory subsystem components to implement data recovery in accordance with some embodiments of the present disclosure.

In FIG. 9, data recovery component 113 retries the decoding of segment $\overline{TU_3}$ 305 using the combined segment data S 905 from Buffer S 240. For example, data recovery component 113 can add S 905 to soft read data for segment $\overline{TU_3}$ 305 determined by probability generator 215. In one embodiment, probability generator 215 uses a lookup table and/or a function to combine S 905 and the LLR or other statistical model data determined by the read of segment $\overline{TU_3}$ 305. For example, probability generator 215 can select a scaling factor from a lookup table and determine the product of the scaling factor and the LLR or other statistical model data determined by the read of segment $\overline{TU_3}$ 305. As another example, probability generator 215 can use a lookup table value to otherwise increase, decrease, or otherwise update the LLR or other statistical model data determined by the read of segment $\overline{TU_3}$ 305. While FIG. 9 illustrates reading the segment $\overline{TU_3}$ 305 from non-volatile memory 205, in one embodiment, the memory subsystem 110 retains the segment $\overline{TU_3}$ 305 after the first decoding failure (e.g., in volatile memory 210) for the subsequent attempt at decoding.

Decoder 220 uses the updated statistical model data to reattempt the decoding of segment $\overline{TU_3}$ 305. When the updated statistical model data is sufficient to overcome the previous failure, decoder 220 produces decoded segment $TU_3$ 910. With decoder bypass 230 inactive, MUX 225 can pass decoded segment $TU_3$ 910 to host 120 in response to the read request. For example, data recovery component 113 can store decoded segment $TU_3$ 910 in volatile memory 210 at a particular address or location and provide that address or location to host 120 to retrieve the requested data.

Figure 10A:
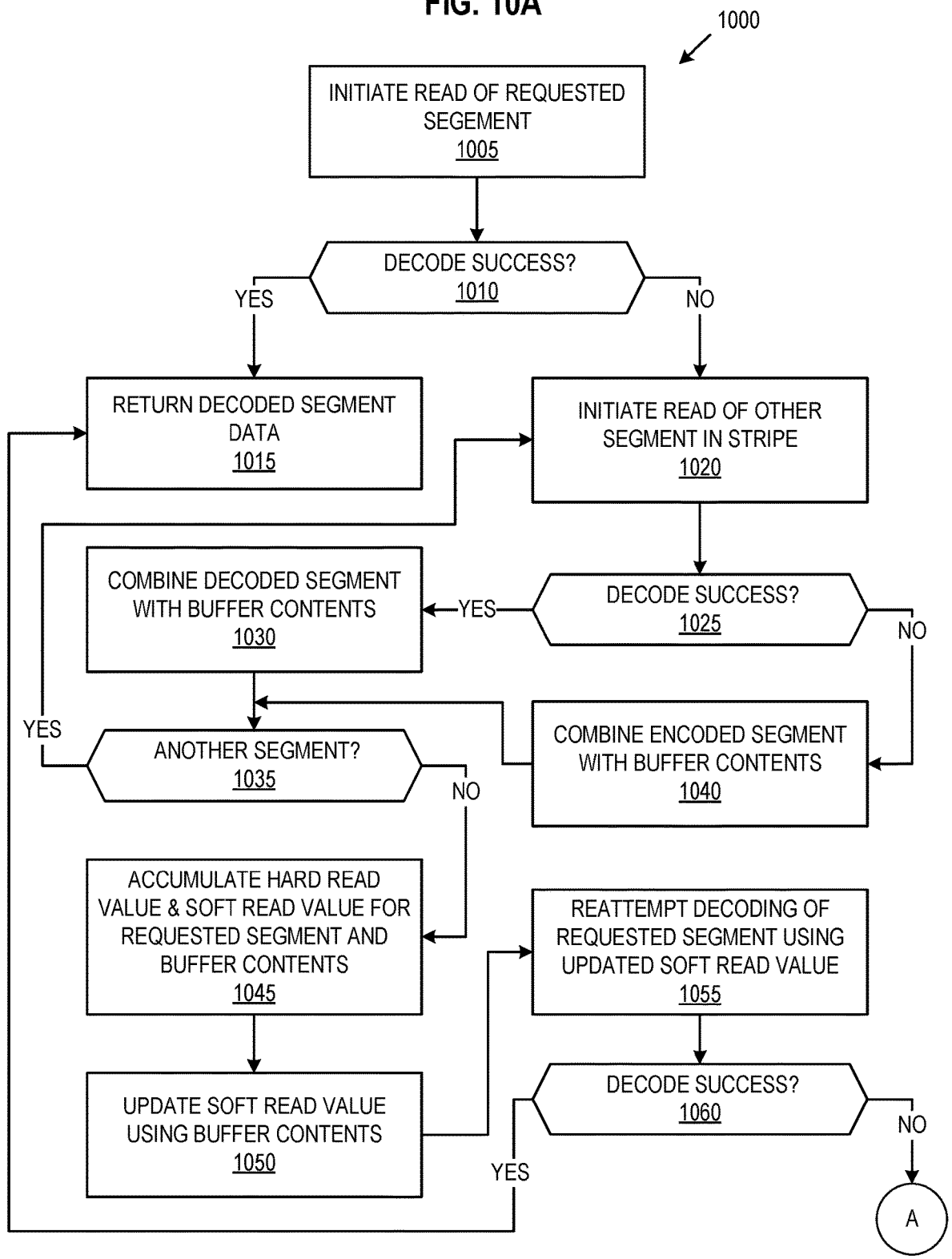
FIG. 10A is a flow diagram of an example method to recover data using a combination of error correction schemes in accordance with some embodiments of the present disclosure.
Figure 10B:
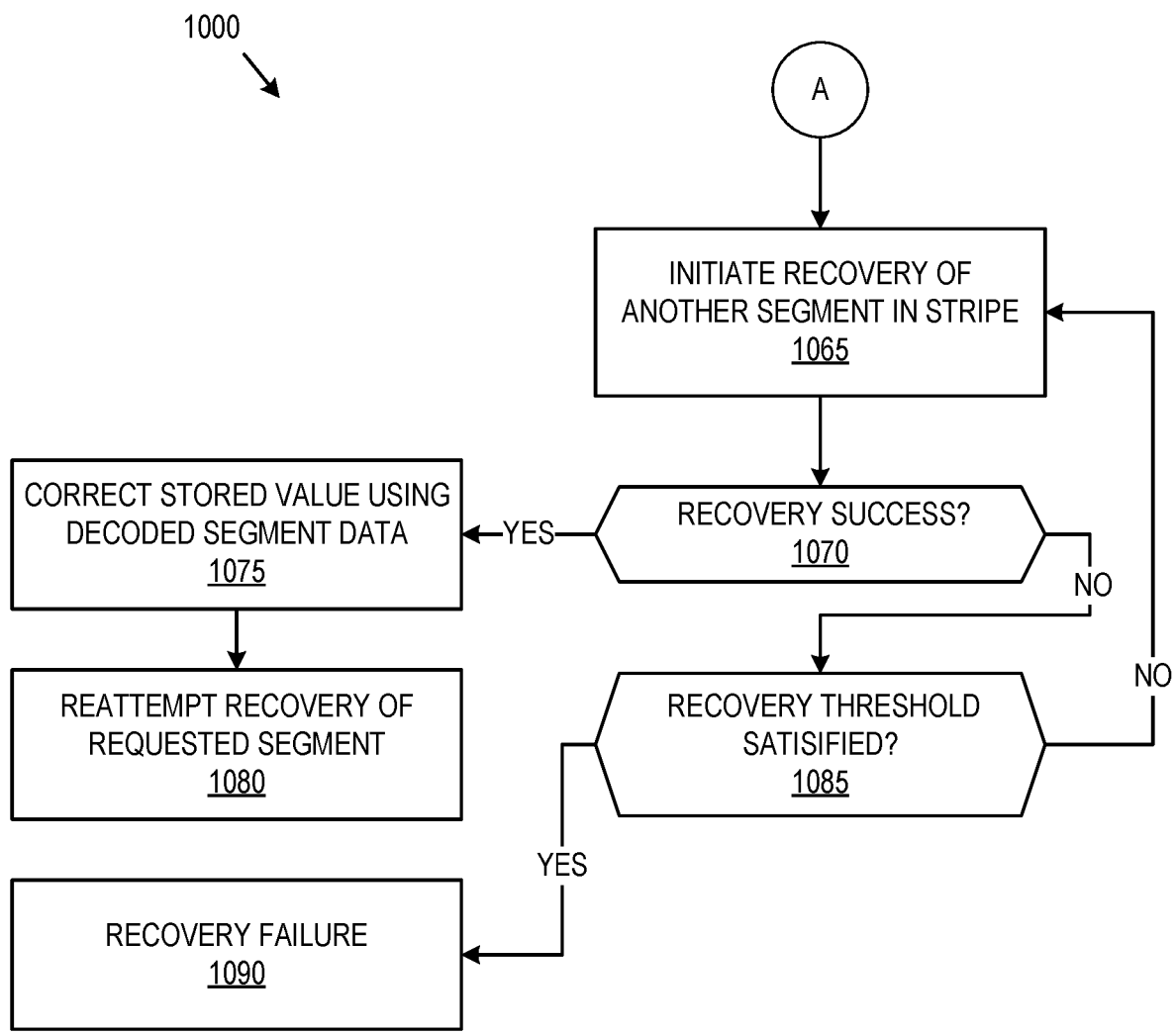
FIG. 10B is a continuation of the flow diagram of the example method to recover data using a combination of error correction schemes in accordance with some embodiments of the present disclosure.

FIG. 10 (illustrated as FIGS. 10A-10B) is a flow diagram of an example method 1000 to recover data using a combination of error correction schemes, in accordance with some embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the data recovery component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1005, the processing device initiates a read of a requested segment. For example, a host system can request a segment data to be read by the memory subsystem. The processing device reads the raw encoded data from non-volatile memory and generates a statistical model as described above. The processing device can use the statistical model in attempt to decode the segment, e.g., according to LDPC or another ECC algorithm.

At operation 1010, the processing device determines if the decoding of the requested segment succeeded or failed. The decoding of the segment fails when the decoder is unable to satisfy the parity checks according to the ECC algorithm.

If the decoding succeeded, at operation 1015, the processing device returns the decoded data. For example, the processing device can alert the host system as to a volatile memory location storing the decoded data in response to the read request.

If the decoding failed, at operation 1020, the processing device initiates the reading of another segment in the stripe of the requested segment. For example, in order to recover the requested data, the processing device will read each of the other segments of the stripe containing the requested segment. Each segment will, in turn, be treated by the processing device as the "current segment."

At operation 1025, the processing device determines if the decoding of the current segment succeeded or failed. If the decoding succeeded, at operation 1030, the processing device combines the decoded segment with the current contents (if any) of a segment buffer. As described above, the combination process can be a simple XOR operation or a more complex combination of using a lookup table and/or formula to generate an updated combined value.

At operation 1035, the processing device determines if another segment in the stripe remains to be processed. If there is another segment, that segment becomes the current segment and the method 1000 returns to operation 1020 to initiate a read of the current segment. If there are not remaining segments in the stripe, the method 1000 proceeds to operation 1045.

If the decoding failed, at operation 1040, the processing device combines the raw encoded segment with the current contents (if any) of a segment buffer. Again, the combination process can be a simple XOR operation or a more complex combination of using a lookup table and/or formula to generate an updated combined value.

At operation 1045, upon combining the read results of the other segments in the stripe, the processing device accumulates a hard read value and one or more soft read values for the requested segment as well as the buffer contents that represent the combination of reads of the other segments in the stripe. For example, the read of the encoded requested segment can result in a hard read value and two soft read values. The combined value resulting from the reads of the other segments in the stripe can be treated as another soft read value or another component of the statistical model for the requested segment.

At operation 1050, the processing device updates the soft read value(s) using the buffer contents. As described above, the processing device can select a scaling factor from a lookup table and determine the product of the scaling factor and the statistical model data determined by the read of requested segment to generate an updated statistical model.

At operation 1055, the processing device reattempts the decoding of the requested segment using the updated statistical model (e.g., updated soft read values). This renewed attempt at decoding the requested data can generate different results due to the use of different input(s) for the soft decoding process.

At operation 1060, the processing device determines if the decoding succeeded. If the decoding succeeded, at operation 1015, the processing device returns the decoded data. If the decoding failed, method 1000 proceeds via off-page connector A to operation 1065.

At operation 1065, the processing device initiates a recovery operation for another segment in the stripe. For example, selects another segment in the stripe that failed during the decoding process and repeats operations 1020-1060 using the newly selected segment as the focus of the recovery process. In one embodiment, the processing device selects another segment for recovery based upon the likelihood of success in recovering the data for that segment. Indicators of this likelihood of success include, for example, one or more of syndrome weights, the number bits flipped, a physical storage location of the segment data with one or more storage devices, statistical model data (LLR) generated when reading the segment, etc.

At operation 1070, the processing device determines if the recovery was a success. For example, if recovery of the newly selected segment results in the return of decoded segment data (at operation 1010), the recovery was a success. If the recovery of the newly selected segment does not result in the return of decoded segment data, instead of proceeding from operation 1060 to operation 1065, method 1000 proceeds to operation 1085.

If the recovery was successful, at operation 1075, the processing device corrects the stored value of the selected segment using the decoded segment data. At operation 1080, the processing device reattempts recovery of the requested segment using the recovered value of the selected statement. Again, this renewed attempt to decode the requested data can proceed as described with reference to operations 1020-1060.

If the recovery was not successful, at operation 1085, the processing device determines if a recovery threshold has been satisfied. For example, a recovery threshold can be satisfied when a number of attempts to recover segments in the current stripe reaches or exceeds a threshold value or an amount of time attempting the recovery of one or more segments reaches or exceeds a threshold amount of time. If the recovery threshold has not been satisfied, method 1000 proceeds to operation 1065 to initiate the recovery of another segment in the stripe.

If the recovery threshold has been satisfied, at operation 1090, the processing device generates an indication of recovery failure.

Figure 11:
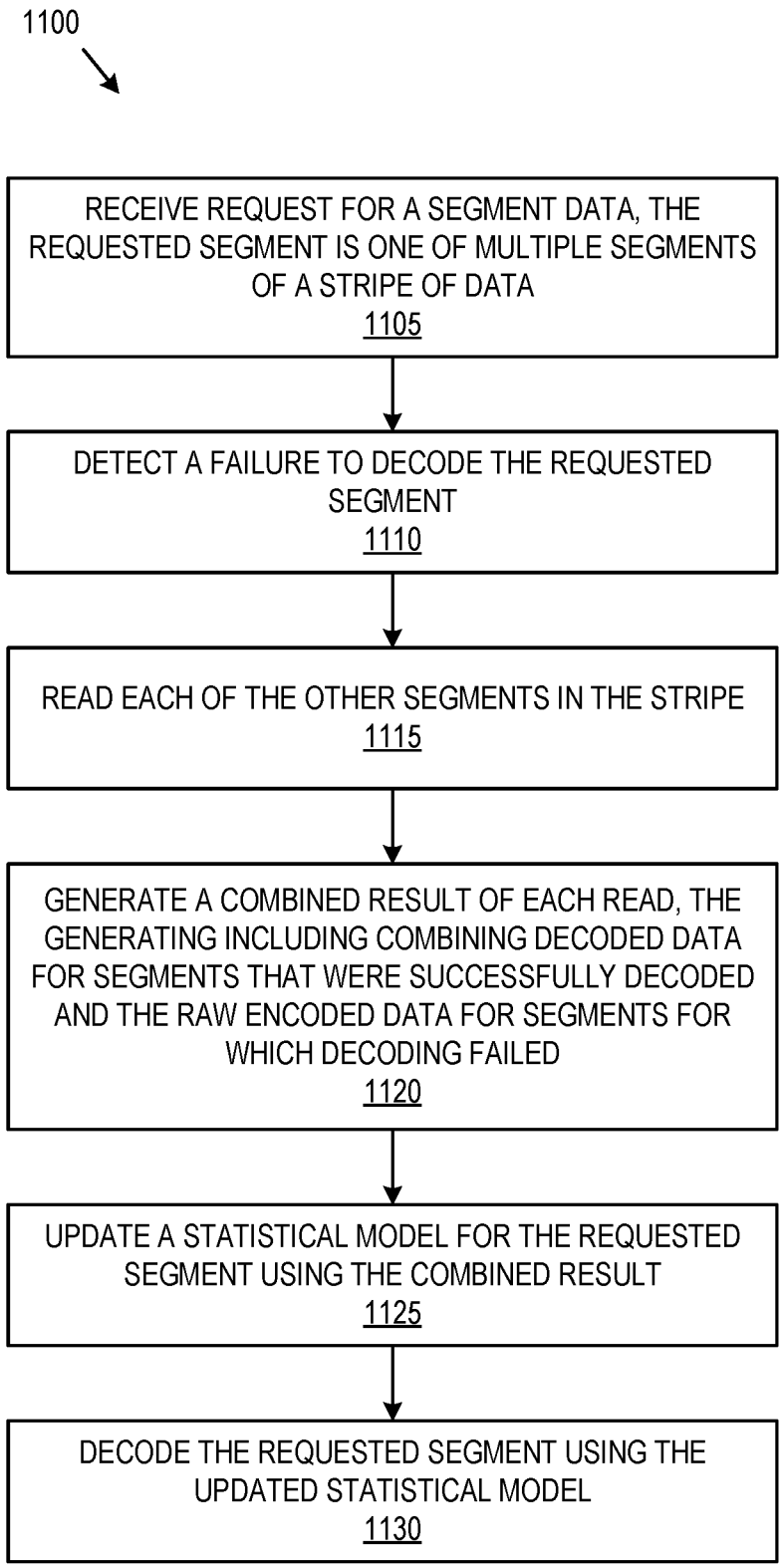
FIG. 11 is a flow diagram of another example method to recover data using a combination of error correction schemes in accordance with some embodiments of the present disclosure.

FIG. 11 is a flow diagram of another example method 1100 to recover data using a combination of error correction schemes, in accordance with some embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the data recovery component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1105, the processing device receives a read request for a segment of data. The segment of data is one of multiple segments of data of a data stripe. For example, the segments of data can make up a RAIN stripe.

At operation 1110, the processing device detects a failure to decode the requested segment. For example, an LDPC or other ECC decoder can iteratively attempt to and subsequently fail to decode the segment of data as described above.

At operation 1115, the processing device reads each of the other segments in the stripe. As described above, each read includes an attempt to decode the current segment.

At operation 1120, the processing device generates a combined result of each read. The generation of combined results includes combining decoded data for segments that were successfully decoded and the raw encoded data for segments for which decoding failed. As described above, the combining of the read results can include applying an XOR function between the result buffer contents and hard read data for each segment, updating the buffer contents each time with the resulting values. In another embodiment, a lookup table and/or another function can be used to combine the read results as described above.

At operation 1125, the processing device updates a statistical model for the requested segment using the combined results of reading the other segments in the stripe. As described above, the processing device can select a scaling factor from a lookup table using the combination of the read results from the other segments or otherwise apply a lookup table and/or formula to update the LLR, soft read values, or other statistical model data for the requested segment.

At operation 1130, the processing device decodes the requested segment using the updated statistical model. As described above, the use of updated inputs for the decoder can result in the soft decoding process successfully decoding the segment. The decoded data can be returned in response to the request.

Figure 12:
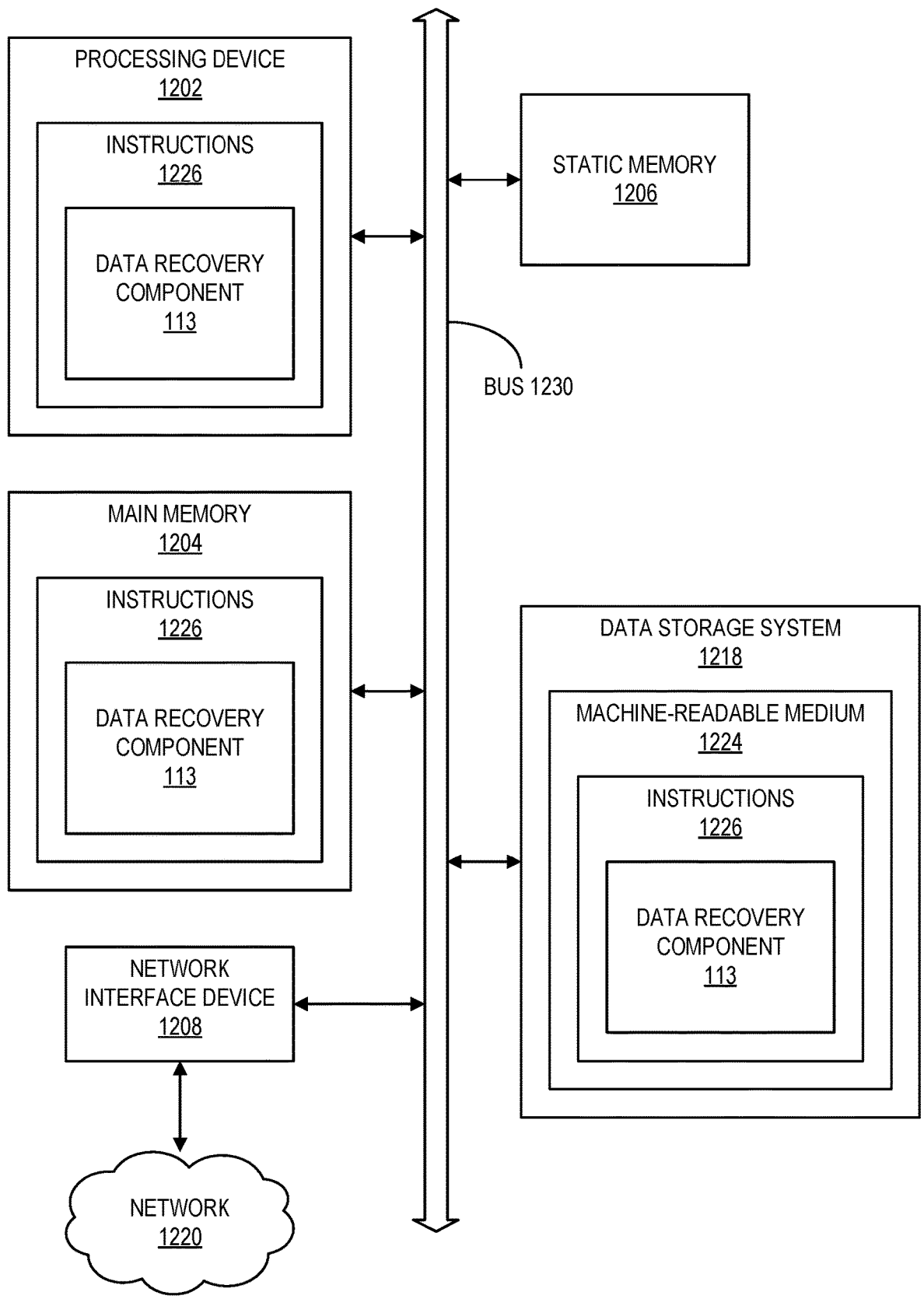
FIG. 12 is a block diagram of an example computer system in which embodiments of the present disclosure may operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the data recovery component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1226 for performing the operations and steps discussed herein. The computer system 1200 can further include a network interface device 1208 to communicate over the network 1220.

The data storage system 1218 can include a machine-readable storage medium 1224 (also known as a computer-readable medium) on which is stored one or more sets of instructions 1226 or software embodying any one or more of the methodologies or functions described herein. The instructions 1226 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory subsystem 110 of FIG. 1.

In one embodiment, the instructions 1226 include instructions to implement functionality corresponding to a data recovery component (e.g., the data recovery component 113 of FIG. 1). While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 1000 and 1100 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving a request for a segment of data, wherein the requested segment data is one of a plurality of segments of data in a stripe of data distributed across a redundant array of storage nodes;
   detecting a failure to decode the requested segment of data;
   reading each of the plurality of segments in the stripe other than the requested segment of data, wherein reading each segment includes reading raw encoded data and attempting to decode the raw encoded data, the result of reading each segment including decoded data when decoding is successful and the raw encoded data when decoding fails;
   generating a combined result of each read, the generating including combining decoded data for segments that were successfully decoded and the raw encoded data for segments for which decoding failed;
   updating a statistical model for the requested segment using the combined result; and
   decoding the requested segment using the updated statistical model.

2. The method of claim 1, wherein the statistical model includes a likelihood of the raw encoded data being correct based on a read voltage level used to read the raw encoded data.

3. The method of claim 2, wherein updating the statistical model includes applying a scaling factor to the likelihood of the raw encoded data being correct based on the read voltage level used to read the raw encoded data.

4. The method of claim 3, further comprising:
   selecting the scaling factor from a lookup table using a syndrome weight for the requested segment of data and a number of failures in the stripe.

5. The method of claim 1, wherein the statistical model includes a likelihood of the raw encoded data being correct based on an error correction scheme used to decode the raw encoded data.

6. The method of claim 1, wherein generating a combined result of each read includes combining bits using an exclusive-or operation.

7. The method of claim 1, further comprising:
   compressing or removing statistical model data from a result of a read prior to combining the result of the read with the results of other reads.

8. The method of claim 1, further comprising:
   detecting a second failure to decode the requested segment of data;
   in response to detecting the second failure, selecting a second segment of the plurality of segments in the stripe for which decoding failed;
   updating a second statistical model for the second segment using a combined result of reads of other segments in the stripe; and
   decoding the second segment using the second statistical model, wherein the combined result of reads used to update the statistical model for the requested segment is based upon the decoded second segment.

9. A non-transitory computer-readable storage medium comprising instructions that, when executed by a processing device, cause the processing device to:
   receive a request for a segment of data, wherein the requested segment data is one of a plurality of segments of data in a stripe of data distributed across a redundant array of storage nodes;
   detect a failure to decode the requested segment of data;
   read each of the plurality of segments in the stripe other than the requested segment of data, wherein reading each segment includes reading raw encoded data and attempting to decode the raw encoded data, the result of reading each segment including decoded data when decoding is successful and the raw encoded data when decoding fails;
   generate a combined result of each read, the generating including combining decoded data for segments that were successfully decoded and the raw encoded data for segments for which decoding failed;
   update a statistical model for the requested segment using the combined result; and
   decode the requested segment using the updated statistical model.

10. The non-transitory computer-readable storage medium of claim 9, wherein the statistical model includes a likelihood of the raw encoded data being correct based on a read voltage level used to read the raw encoded data.

11. The non-transitory computer-readable storage medium of claim 10, wherein updating the statistical model includes applying a scaling factor to the likelihood of the raw encoded data being correct based on the read voltage level used to read the raw encoded data.

12. The non-transitory computer-readable storage medium of claim 11, wherein the processing device is further to:
select the scaling factor from a lookup table using a syndrome weight for the requested segment of data and a number of failures in the stripe.

13. The non-transitory computer-readable storage medium of claim 9, wherein the statistical model includes a likelihood of the raw encoded data being correct based on an error correction scheme used to decode the raw encoded data.

14. The non-transitory computer-readable storage medium of claim 9, wherein generating a combined result of each read includes combining bits using an exclusive-or operation.

15. The non-transitory computer-readable storage medium of claim 9, wherein the processing device is further to:
compress or remove statistical model data from a result of a read prior to combining the result of the read with the results of other reads.

16. The non-transitory computer-readable storage medium of claim 9, wherein the processing device is further to:
detect a second failure to decode the requested segment of data;
in response to detecting the second failure, select a second segment of the plurality of segments in the stripe for which decoding failed;
update a second statistical model for the second segment using a combined result of reads of other segments in the stripe; and
decode the second segment using the second statistical model, wherein the combined result of reads used to update the statistical model for the requested segment is based upon the decoded second segment.

17. A system comprising:
a plurality of memory devices; and
a processing device, operatively coupled with the plurality of memory devices, to:
receive a request for a segment of data, wherein the requested segment data is one of a plurality of segments of data in a stripe of data distributed across a redundant array of storage nodes;
detect a failure to decode the requested segment of data;
read each of the plurality of segments in the stripe other than the requested segment of data, wherein reading each segment includes reading raw encoded data and attempting to decode the raw encoded data, the result of reading each segment including decoded data when decoding is successful and the raw encoded data when decoding fails;
generate a combined result of each read, the generating including combining decoded data for segments that were successfully decoded and the raw encoded data for segments for which decoding failed;
update a statistical model for the requested segment using the combined result wherein the statistical model includes a likelihood of the raw encoded data being correct based on a read voltage level used to read the raw encoded data; and
decode the requested segment using the updated statistical model.

18. The system of claim 17, wherein updating the statistical model includes applying a scaling factor to the likelihood of the raw encoded data being correct based on the read voltage level used to read the raw encoded data.

19. The system of claim 18, wherein the processing device is further to:
select the scaling factor from a lookup table using a syndrome weight for the requested segment of data and a number of failures in the stripe.

20. The system of claim 17, wherein the processing device is further to:
detect a second failure to decode the requested segment of data;
in response to detecting the second failure, select a second segment of the plurality of segments in the stripe for which decoding failed;
update a second statistical model for the second segment using a combined result of reads of other segments in the stripe; and
decode the second segment using the second statistical model, wherein the combined result of reads used to update the statistical model for the requested segment is based upon the decoded second segment.

* * * * *